United States Patent
Fricker

(10) Patent No.: US 10,178,806 B1
(45) Date of Patent: Jan. 8, 2019

(54) QUICK-DISCONNECT TRANSLATABLE FAN TRAY FOR ELECTRONICS ENCLOSURE

(71) Applicant: EMC Corporation, Hopkinton, MA (US)

(72) Inventor: Jean-Philippe Fricker, Menlo Park, CA (US)

(73) Assignee: EMC IP Holding Company, LLC, Hopkinton, MA (US)

( * ) Notice: Subject to any disclaimer, the term of this patent is extended or adjusted under 35 U.S.C. 154(b) by 430 days.

(21) Appl. No.: 14/977,042

(22) Filed: Dec. 21, 2015

(51) Int. Cl.
H05K 7/18 (2006.01)
H05K 7/20 (2006.01)

(52) U.S. Cl.
CPC ......... *H05K 7/20581* (2013.01); *H05K 7/183* (2013.01); *H05K 7/20718* (2013.01); *H05K 7/20836* (2013.01)

(58) Field of Classification Search
CPC ............... H05K 7/20581; H05K 7/183; H05K 7/20718; H05K 7/20836
USPC ....................................................... 361/695
See application file for complete search history.

(56) References Cited

U.S. PATENT DOCUMENTS

| | | | | |
|---|---|---|---|---|
| 4,744,005 A * | 5/1988 | Milani | ............... | H05K 7/20172 361/679.48 |
| 5,562,410 A * | 10/1996 | Sachs | .................. | F04D 29/601 361/695 |
| 6,414,845 B2 * | 7/2002 | Bonet | ................. | H05K 7/20581 312/236 |
| 6,594,148 B1 * | 7/2003 | Nguyen | ............. | H05K 7/20563 361/695 |
| 6,817,889 B2 * | 11/2004 | Chang | ................ | H05K 7/20172 439/485 |
| 6,999,313 B2 * | 2/2006 | Shih | ..................... | H05K 7/20172 165/104.33 |
| 7,054,155 B1 * | 5/2006 | Mease | ................ | H05K 7/20581 165/104.34 |
| 7,126,818 B2 * | 10/2006 | Lu | ............................. | G06F 1/20 361/695 |
| 7,813,121 B2 * | 10/2010 | Bisson | ............... | H05K 7/20736 361/679.5 |
| 8,116,082 B2 * | 2/2012 | Beaudoin | ........... | H05K 7/20581 211/41.17 |
| 8,988,877 B2 * | 3/2015 | Cash | ........................ | G06F 1/20 361/679.5 |
| 9,253,927 B1 * | 2/2016 | Kull | .................... | H05K 7/20581 |

* cited by examiner

*Primary Examiner* — Anatoly Vortman
(74) *Attorney, Agent, or Firm* — Barry N. Young

(57) ABSTRACT

A universal quick-disconnect fan tray for air cooling of field replaceable electronic units within a rack-mount enclosure comprises a pair of fan modules mounted in parallel on an intermediate printed circuit board for providing a unidirectional air flow through the enclosure. The printed circuit board has asymmetrically located spring-loaded pogo pin electrical contacts and a pogo pin mechanical locator for respectively engaging cooperating front or rear electrical pads and cooperating front and rear locator features within the enclosure for correctly locating and providing electrical connections to the fan tray and that afford quick connect and disconnect. The locations of the cooperating pads and features enable the fan tray to be translatable without being rotated from the front to the rear of the enclosure to maintain same direction of airflow.

16 Claims, 5 Drawing Sheets

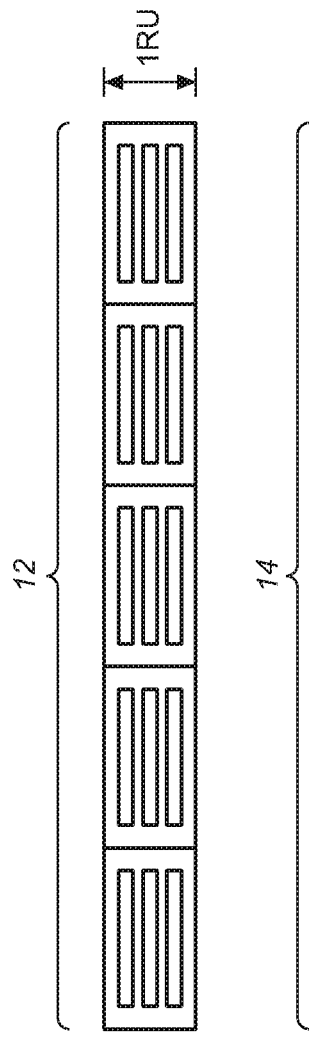
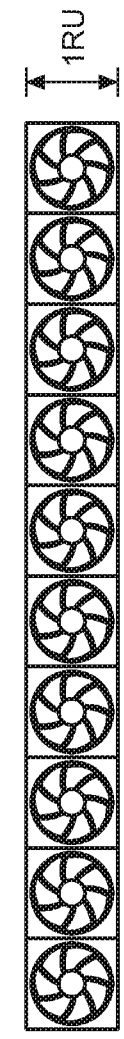
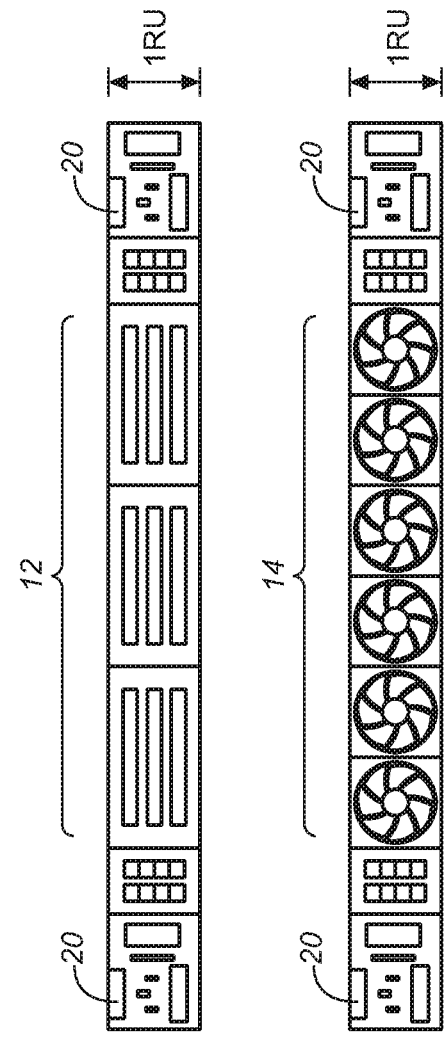
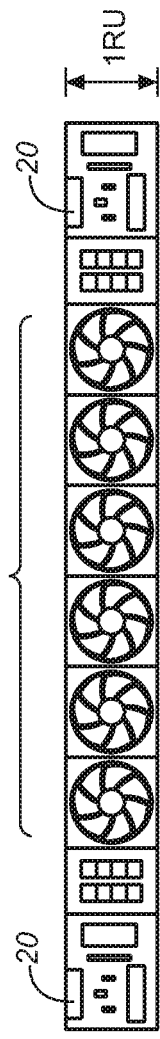
FIG. 5A
FIG. 5B
FIG. 5C
FIG. 5D

QUICK-DISCONNECT TRANSLATABLE FAN TRAY FOR ELECTRONICS ENCLOSURE

BACKGROUND

This invention relates generally to cooling of electronics enclosures using fan trays, and more particularly to quick-disconnect fan trays for a rack-mount electronics enclosure for field serviceable components.

During operation, electronic components generate heat. When tightly packed together in enclosures or located in high heat environments such as is encountered in rack-mounted electronic equipment, it is important to cool the electronics by removing the heat to prevent failure and to ensure proper operation. Air cooling is the dominant mode of removing heat in most applications. The high power dissipation in many types of electronic component enclosures, such as for semiconductor memory, for example, requires fans to provide adequate airflow to ensure proper thermal management within the enclosures. Frequently, multiple fans may be necessary to provide sufficient airflow, and the fans must be mounted within or closely adjacent to the exterior of the electronics enclosure to ensure adequate airflow over the electronics. Typically, the fans are arranged as fan trays.

Fans are subject to failure due to wear of mechanical parts such as bearings or the accumulation of dust, and failed fans must be replaced reasonably promptly to prevent damage to the electronics. If the fans are built into the electronic enclosures, an enclosure must be physically disassembled to remove and replace a failed fan. If the enclosure is rack mounted, this may necessitate physically removing the enclosure from the rack, which may require disconnecting multiple cables from the enclosure and powering down the electronics. This may also be the case to service or replace a failed electronics module within the enclosure. Even if the electronics modules are hot-swappable, disassembly of the enclosure to remove a fan may still be necessary to obtain access to the electronics module. In applications where equipment must be powered up and functional continuously, such as in data processing applications, taking equipment off-line for maintenance or replacement of components is disruptive and undesirable.

It is desirable to provide quick-disconnect fan tray modules for forced air cooling of electronic components where the fan tray modules can be easily removed and replaced to afford access to the electronic components for service without the necessity of disassembly of an enclosure. Moreover, it is also desirable to provide universal translatable fan trays that can be used in any position with an enclosure. It is to these ends at the present invention is directed.

BRIEF DESCRIPTION OF THE DRAWINGS

FIG. 5A is a diagrammatic front vertical cross-sectional view of the enclosure of FIG. 2 taken approximately along the line 5A-5A behind the fan trays and showing five groups of three field replaceable units;

FIG. 5B is a diagrammatic front vertical cross-sectional view of the enclosure of FIG. 2 taken approximately along the line 5B-5B behind a front faceplate showing the fan trays installed;

FIG. 5C is a diagrammatic rear vertical cross-sectional view of the enclosure of FIG. 2 taken approximately along the line 5C-5C behind the rear fan trays and showing three groups of three field replaceable units;

FIG. 5D is a diagrammatic rear vertical cross-sectional view of the enclosure of FIG. 2 taken approximately along the line 5D-5D showing three fan trays installed;

DESCRIPTION OF PREFERRED EMBODIMENTS

This invention is particularly adaptable for use with rack-mounted electronic equipment enclosures for field replaceable electronic components, such as semiconductor flash memory modules, and will be described in that context. As will be appreciated, however, this is illustrative of only one utility of the invention, and that the invention may be used advantageously in other applications and for other purposes.

Figure 1:
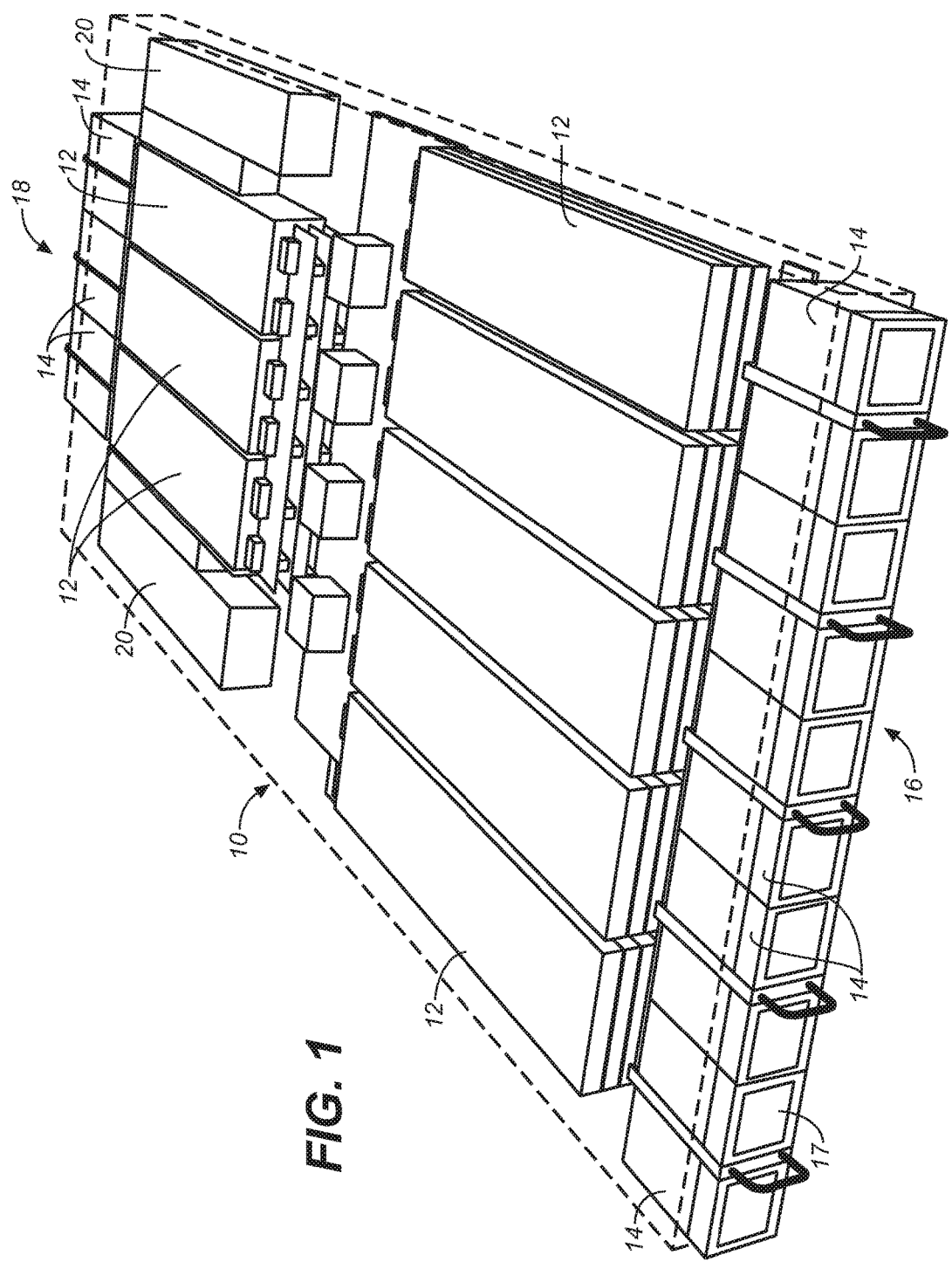
FIG. 1 is a perspective view of a rack-mountable electronic component enclosure, partially broken away, for field replaceable electronic units embodying the invention.
Figure 2:
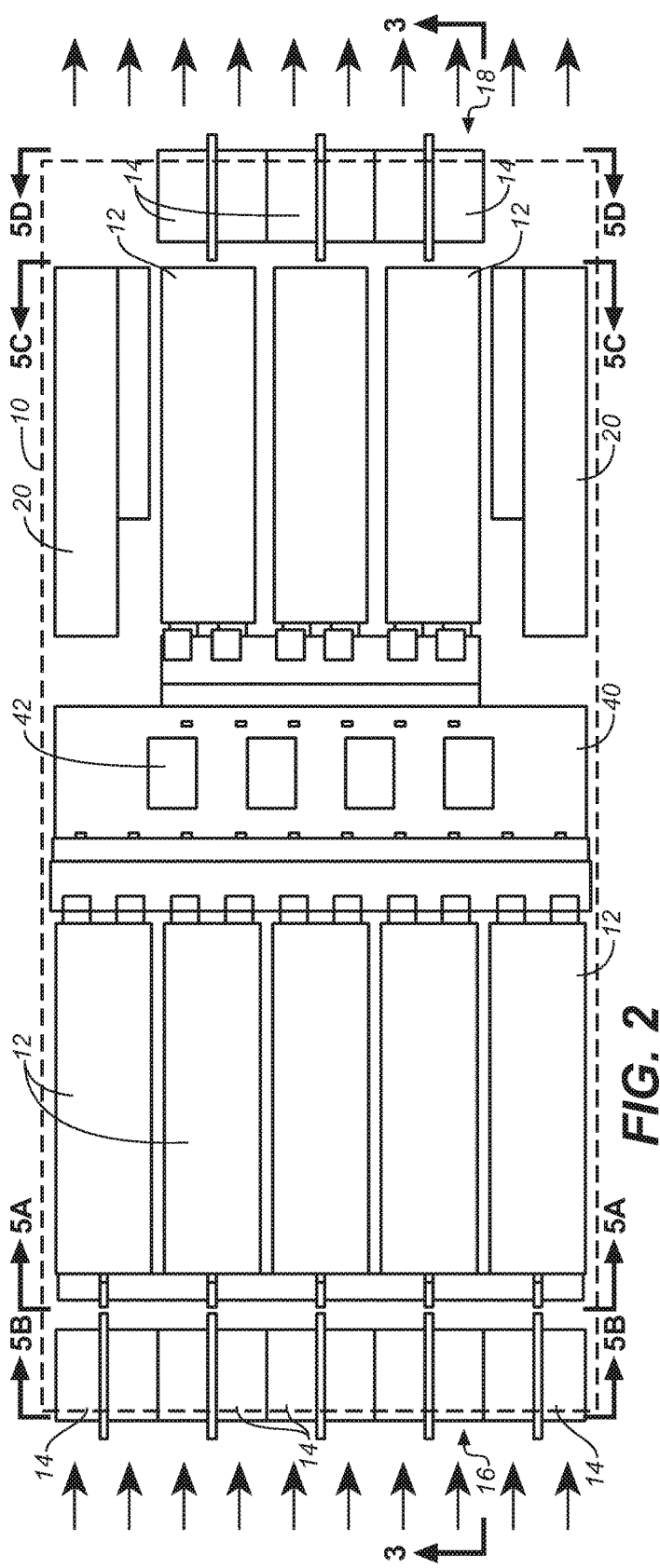
FIG. 2 is a diagrammatic top view of the electronic component enclosure of FIG. 1.

FIGS. 1 and 2 illustrate, respectively, a front perspective and a top view of a rack-mountable electronic component enclosure 10 for electronic assembly comprising field replaceable electronic component units (FRUs) 12. As best illustrated in FIGS. 5A and 5C, there may be five bays (stacks) of three FRUs 12 (fifteen total) located in the front part 16 of enclosure 10, and three bays (stacks) of three FRUs 12 (nine total) located in the rear part 18 of enclosure 10. In an embodiment, all of the FRUs may be similar semiconductor flash memory modules (FMs) comprising printed circuit boards holding arrays of integrated circuit semiconductor flash memory chips for providing nonvolatile memory and data storage as for a computer system, for example. As will be described in more detail below, a plurality of fan trays 14 may be located at the front 16 of the enclosure in front of the FRUs, and another plurality of fan trays 14 may be located at the rear 18 of the enclosure behind the FRUs. The fan trays may comprise fan modules (to be described) for providing a forced airflow through the enclosure for cooling the FRUs (as indicated by the arrows in FIGS. 2 and 3), and are located between the FRUs and the exterior of the enclosure for unimpeded air intake and exhaust. The enclosure 10 may also comprise power supply units (PSU) 20 for supplying electrical power to components within the enclosure, such as the FRUs and the fan modules.

Figure 3:
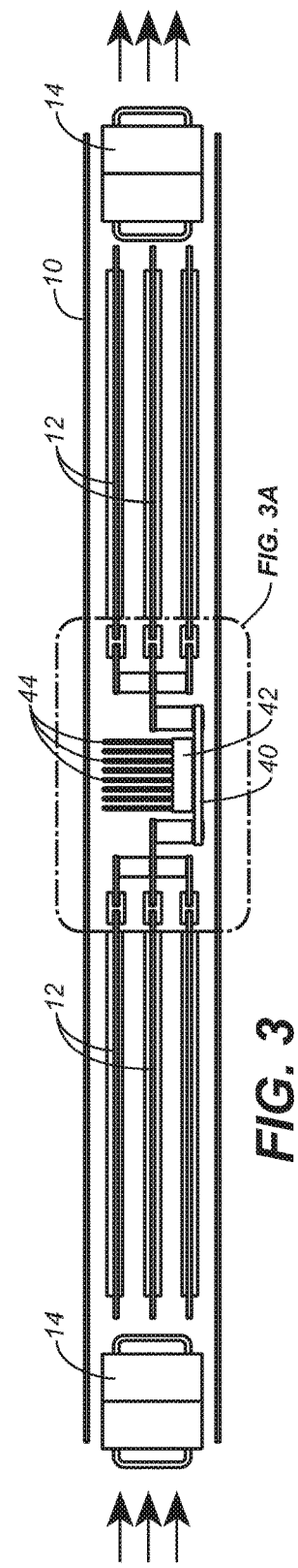
FIG. 3 is a diagrammatic vertical cross-sectional view of the enclosure of FIG. 2 taken approximately along the lines 3-3.
Figure 3A:
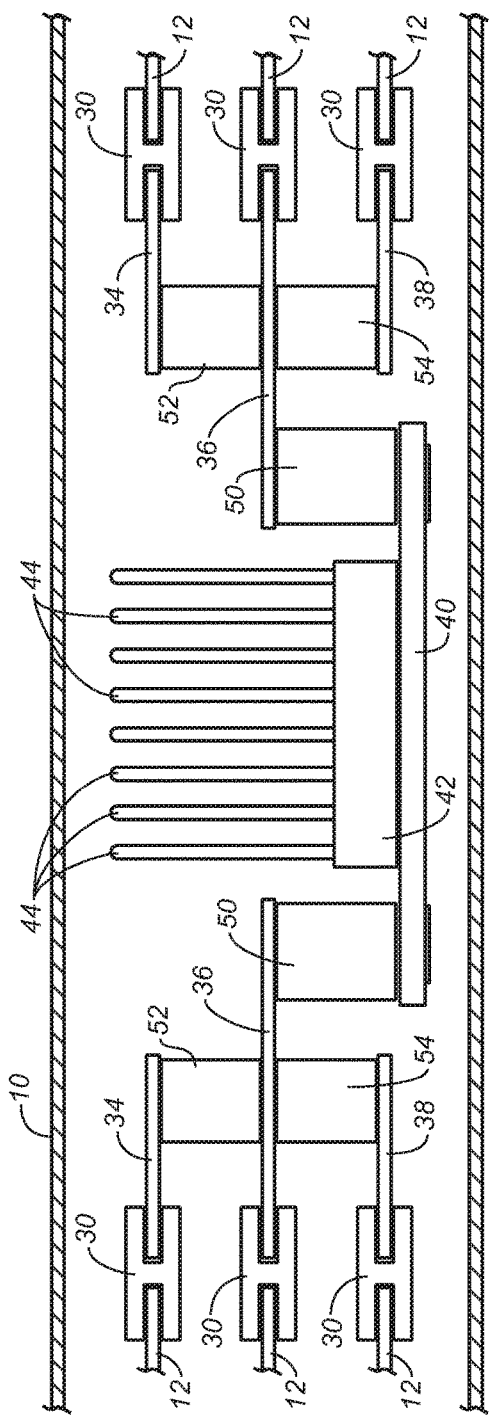
FIG. 3A is a blown up view of the center portion of the enclosure of FIG. 3 indicated by the chain-dotted line.

As best illustrated in FIGS. 3 and 3A, each FRU may be received within a corresponding coplanar connector 30 for electrical connection via intermediate upper, middle or lower printed circuit boards 34, 36 or 38, respectively, to a main printed circuit board 40. The main printed circuit board may be a memory control board having a plurality of integrated circuit chips 42 for controlling access to the FRUs for the storage and retrieval of data in the FMs. The integrated circuit chips 42 may each have a plurality of pins or tubes 44 extending from the chip to form a heat exchanger. The heat exchanger may extend vertically from each chip to be in the airflow through the enclosure to dissipate heat from the chips on the main printed circuit board.

As is apparent from the figures, FRUs 12 in the front part of the enclosure at 16 and in the rear part of the enclosure at 18 may be arranged and connected as mirror images of each other to the main printed circuit board 40 (other than the number of bays in each part). As will be described, the FRUs in the front part of the enclosure may be inserted into the enclosure from the front side 16 of the enclosure and the FRUs in the rear part of the enclosure may be inserted into the enclosure from the rear side 18 of the enclosure, after removal of the appropriate fan trays 14. The main printed circuit board 40 may be located in a center portion of the enclosure and be electrically and mechanically connected by vertical connectors 50 to the middle printed circuit boards 36. The middle printed circuit boards 36 may be electrically and mechanically connected by vertical connectors 52 to the upper print circuit boards 34 and electrically and mechanically connected by vertical connectors 54 to the lower printed circuit boards 38. This arrangement allows the height of the vertical connectors to be adjusted as necessary to accommodate different heights of the FRUs. Additionally, the vertical connectors and the various printed circuit boards may be mechanically connected to the housing 10 by standoffs (not shown) in a well-known matter.

As indicated in FIGS. 5A-5D, the height of the enclosure 12 may be 1 RU (standard rack unit), making it a very compact arrangement. As may be appreciated, the FRUs as well as any other electronics within the enclosure may consume significant power and generate significant heat. Excess heat can cause failure of electronic components, such as memory chips, and this heat must be dissipated to ensure proper operation. Heat dissipation is afforded by the forced airflow through the enclosure provided by the fan modules of the fan trays 14. Because of the small confined space within the enclosure, it is important to ensure that a proper airflow through the enclosure is maintained to afford the required amount of cooling. This imposes a substantial burden on the fan modules. As such, fan modules may fail at times due to wear, dust or other factors, and have to be replaced. It is important to be able to replace fan modules quickly to avoid excess heat buildup which can damage the FRUs or cause them to malfunction, and that the modules be hot-swappable in order to avoid downtime. Also, at times flash memory in a FRU may fail, and the FRU will need to be replaced. It is important to be able to accomplish this quickly without the necessity of disassembling the enclosure to obtain access to the failed FRU. For both of these reasons, it is desirable to have fan trays able to be disconnected and removed quickly in order to replace the fan tray or to gain access to replace a failed FRU. It is also desirable to have fan trays which are universal and can be swapped and used independently in front and rear and in any position of the enclosure to avoid the necessity of stocking spare fan trays of different types or having different model numbers for the ones to be located in the front to the ones to be located in the rear of the enclosure. The invention accomplishes these objectives, as will be described below.

Figure 4:
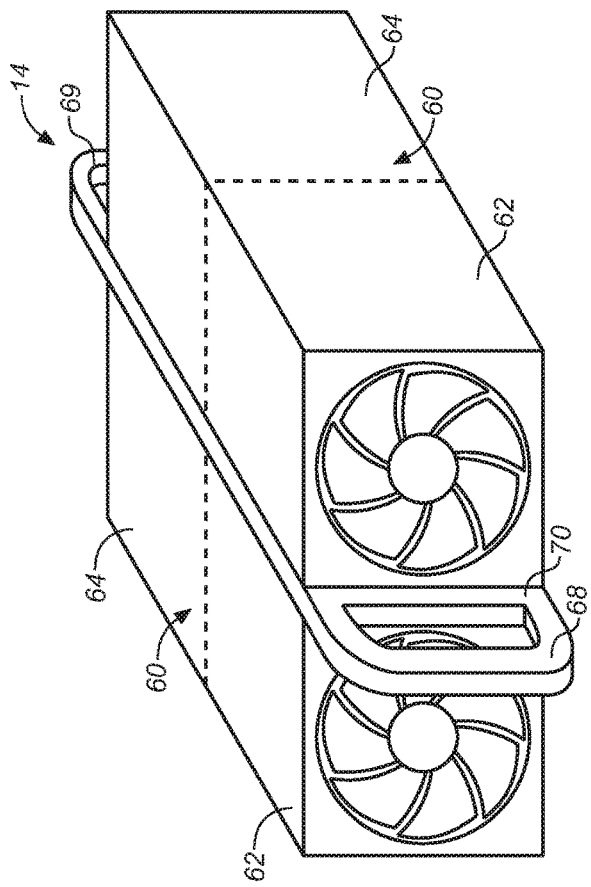
FIG. 4 is a perspective view of a quick-disconnect translatable fan tray comprising two back-to-back dual fan modules in accordance with an embodiment of the invention.

FIG. 4 is a perspective view of a universal fan tray 14 in accordance with a preferred embodiment of the invention. As shown, the fan tray may comprise two dual fan modules 60 each module comprising a pair of counter rotating fans 62, 64 in a back-to-back push-pull serial arrangement to provide a unidirectional airflow. A first fan 62 of a fan module may be an intake fan that pulls air into the module, and the second fan 64 may push the intake air out of the fan module, to provided airflow from fan 62 through fan 64. In an embodiment, each fan module may be comprise brushless DC PWM variable speed fans, such as are commercially available, for instance, from Delta Electronics, Inc. of Taiwan, R.O.C. The two fan modules 60 of a fan tray operate in parallel so that each of the two modules provide unidirectional airflow in the same direction. The parallel airflow provided by the two fan modules divides the total fan tray airflow between the two fans, and increases airflow rate according to the number of fans. Since the flow through the series connected fans of each fan module is the same, the total pressure drop is divided between the two fans of the module.

Figure 6A:
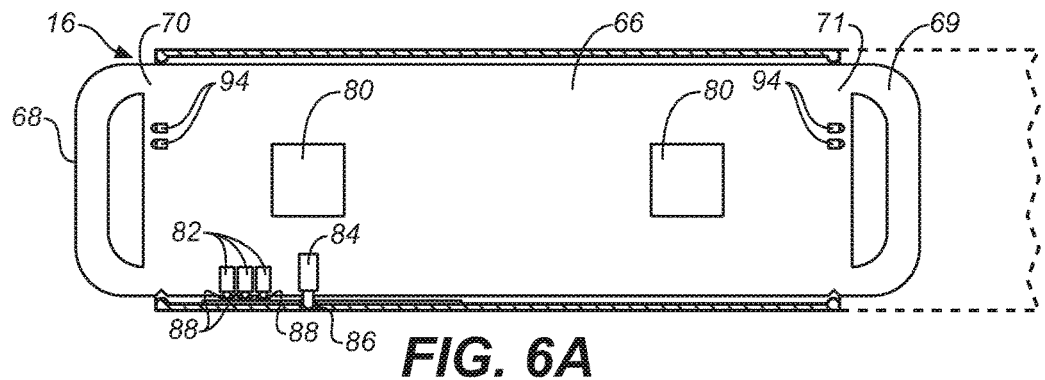
FIG. 6A illustrates a printed circuit control board for the fan tray of FIG. 4 inserted into the front of the enclosure of FIGS. 1 and 2.
Figure 6B:
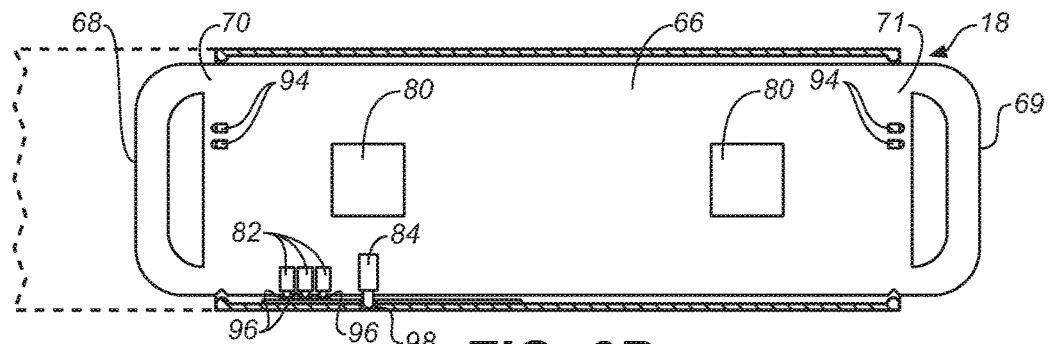
FIG. 6B illustrates the printed circuit control board of FIG. 6A translated to the rear and inserted into the back of the enclosure of FIGS. 1 and 2.
Figure 7:
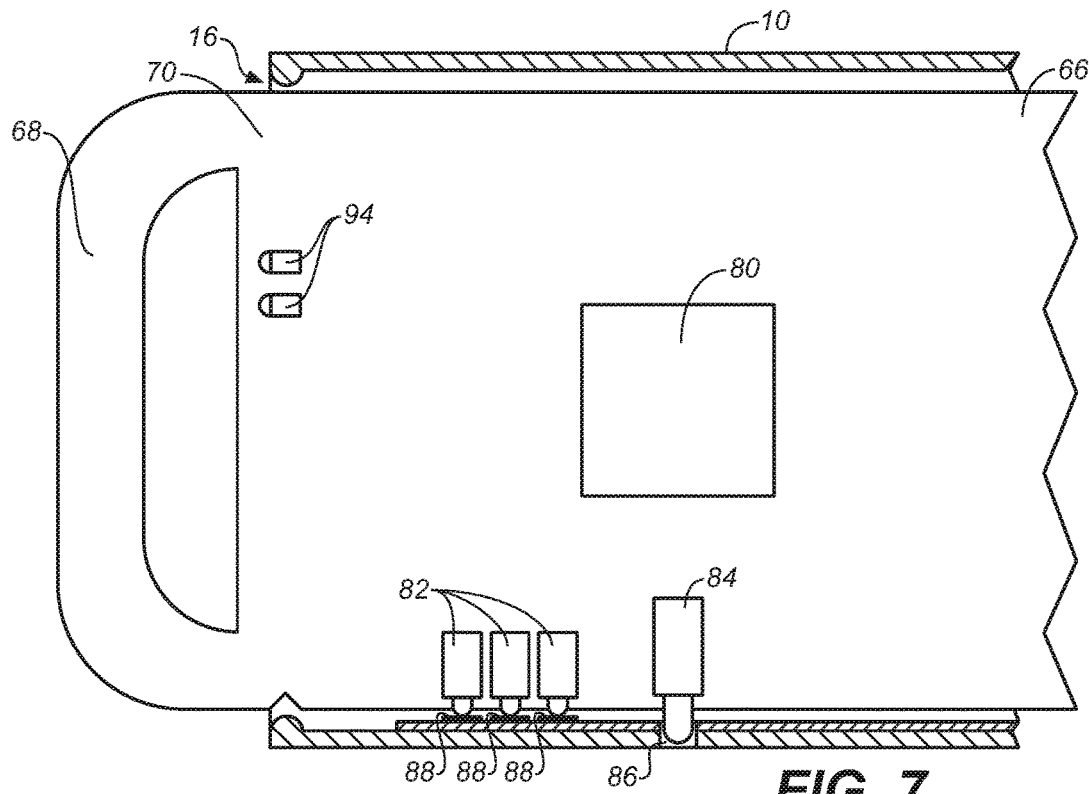
FIG. 7 is an enlarged view of a portion of the printed circuit control board and enclosure of FIG. 6A illustrating the electrical and mechanical connections of the print circuit board.

The two fan modules 60 may be connected together with a printed circuit board 66 interposed between the modules to form the fan tray 14. The printed circuit board (which is shown in more detail in FIGS. 6A-6B and 7) may comprise integrated circuit chips 80 for, among other things, control of the fan modules. As shown in FIGS. 6A-6B and 7, the printed circuit board 66 may extend beyond the ends of the fan modules 60 and provide front and rear handles 68, 69, respectively, which, as will be described, allow the fan tray 14 to be pulled from and inserted into the enclosure 10 for replacement of a fan tray or to gain access to an FRU 12. Additionally, the extended portions 70, 71 of the printed circuit board 66 may operate as an airflow coupling barrier to minimize airflow coupling between the two modules of the fan tray. The handles 68, 69 may also be part of the fan module rather than extensions of the printed circuit board, In order to provide adequate directional airflow through the housing 10, the fan modules 60 of the fan tray 14 at the front 16 of the enclosure and the fan modules of the fan tray 14 at the rear 18 of the enclosure must provide airflow in the same direction. Therefore, if the fan modules at the front 16 of the enclosure pull (intake) outside air into the enclosure and push the outside air through the enclosure, the fan modules at the rear 18 of the enclosure must provide airflow in the same direction by pulling air from inside the enclosure through an air intake 17 and pushing it outside at the rear 18 of the enclosure, as shown by the arrows in FIGS. 2 and 3. If the front and rear fan modules would both pull outside air into the enclosure, or both exhaust enclosure interior air out of the enclosure, a pressure area could be created within the interior of enclosure which could inhibit airflow and prevent proper cooling and heat dissipation. Thus, the front and rear fan modules are preferably oriented to provide airflow in the same direction relative to the enclosure, typically front to rear as it is common for rack-mounted equipment.

In order to provide the desirable ability to quickly replace a fan tray, as well as to enable a fan tray to be used in either the front or the rear of the enclosure while maintaining the correct orientation to provide the proper unidirectional airflow, the enclosure and the fan trays are designed, in accordance with the invention, to enable a fan tray to be used in either a front location 16 or a rear location 18 of the enclosure by translating the fan tray from front to rear without reorienting it, i.e., without the fan tray being rotated about a vertical axis, so that the fan tray maintains the same orientation relative to the enclosure in either location and the fan modules provide airflow in the same direction in both front and rear locations. In a preferred embodiment, the invention accomplishes this by using cooperating elements on both the printed circuit board 66 of the fan tray and the enclosure 10 to afford both mechanical and electrical connection and correct positioning of the fan modules within the enclosure. This is accomplished as illustrated in FIGS. 6A-6B and 7.

FIG. 6A illustrates the cooperation between the printed circuit board 66 of a fan tray and the enclosure 10 with the fan tray inserted into the front end 16 of the enclosure; and FIG. 6B illustrates the cooperation between the printed circuit board of the same fan tray and the enclosure with the fan tray translated without rotation and inserted into the rear 18 of the enclosure.

As shown in FIGS. 6A and 6B, and in more detail in FIG. 7, in accordance with an embodiment of the invention, printed circuit board 66 may have a plurality of pogo pins 82 at predetermined locations adjacent one side of the printed circuit board (the lower side in the figures) that are electrically connected to circuit elements on the printed circuit board. The pogo pins comprise known spring-loaded movable electrical contacts, such as are commercially available from Mill-Max Mfg. Corporation of New York, that are biased to project outwardly beyond the edge of the printed circuit board to contact and cooperate with corresponding electrical pads 88 on a thin film electrical circuit element mounted within the bottom of the enclosure 10. The printed circuit board may additionally have another one (or more) preferably larger pogo pins 84 (or other spring-biased mechanical latch) also at another predetermined location adjacent to the side of the printed circuit board that mechanically cooperate with an indentation or a hole 86 in the bottom of the enclosure when the fan tray is properly positioned within the enclosure to provide a mechanical locator for the correct position of the fan tray. As shown in FIG. 7, when the fan tray is properly positioned within the enclosure 10, pogo pin 84 and hole 86 provide a mechanical stop and retention that locates and retains the printed circuit board (and fan tray) properly so that the pogo pins 82 align with and contact corresponding electrical pads 88. This provides electrical connections to the main printed circuit board and/or the power supply units within the enclosure. As may be appreciated, this arrangement of movable electrical contacts and movable mechanical locator element could be reversed, with the movable elements being located within the enclosure and cooperating fixed elements being located on the printed circuit board. Electrical power and control signals may be provided via the electrical contact pads 88 and pogo pins 82 to and from circuit elements on the printed circuit board and the fan modules. The control signals may include, for example, signals from a temperature sensor and/or an air flow sensor (not shown) to control fan speed of the fans or to detect and provide an alarm signal in the event of a fan module failure. The printed circuit board may also have sets of LEDs 94 (two sets of two LEDs being shown in the figures) or other electrical indicators positioned adjacent to each end of the printed circuit board 66, for instance, so as to be visible from the exterior of the enclosure when the fan tray in inserted into either the front or the rear of the enclosure. The LEDs may be different colors and may be used, for example, to signal when the fan tray is inserted incorrectly into the housing to provide proper airflow and operation, and they may provide an alarm indication of a fault.

As indicated in FIGS. 6A-6B and 7, pogo pins 82 and 84 may be located on the printed circuit board 66 asymmetrically relative to its midpoint, for example, adjacent one end of the printed circuit board such as the end adjacent to handle 68. Similarly, as shown in FIG. 6A, detent 86 and contact pads 88 may be located within the enclosure adjacent to the front end 16 of the enclosure and positioned to mate with pogo pins 82 and 84, respectively, when the fan tray is correctly inserted into the front of the enclosure. Furthermore, as shown in FIG. 6B, contacts 96 and detent 98 may be located within the enclosure the appropriate distances inwardly from the rear 18 of the enclosure to mate with pogo pins 82 and 84, respectively, on the printed circuit board 66 when the fan tray is translated to and inserted correctly into the rear of the enclosure. The LEDs 94 adjacent to the handle 69 of the printed circuit board may operate in the same way as described above for the LEDs adjacent to handle 68 to indicate correct orientation and operation of the fan tray. This enables the same fan tray to be translated from the front to the rear of the enclosure with the correct orientation to provide unidirectional airflow through the enclosure.

As may be appreciated, other forms and arrangements of electrical contacts and mechanical stops may be provided for electrical connection and correct positioning of the fan modules within the enclosure, including providing electrical connections and mechanical stops on the fan modules 60 themselves.

While the foregoing has been with reference to particular embodiments of the invention, it will be appreciated that changes to these embodiments may be made without departing from the principles and spirit of the invention, the scope of which is defined in the appended claims.

The invention claimed is:

1. Apparatus for cooling electronic components within an enclosure, the enclosure having a front part and a rear part, comprising:
   a fan tray formed to be quickly inserted into and removed from either the front part or the rear part of the enclosure; and
   a fan module as part of said fan tray for providing an airflow in a predetermined direction through the enclosure to remove heat from said electronic components, the fan tray having electrical contacts and a mechanical locator element that cooperate with either corresponding front or rear electrical contact pads and either corresponding front or rear mechanical features within the enclosure for electrical power and correct positioning to enable insertion of the fan tray into either said front part or said rear part of the enclosure while maintaining the same physical orientation of the fan tray relative to the enclosure and the same airflow direction from the fan module through the enclosure when inserted into either the front part or the rear part; and
   wherein said fan tray comprises two fan modules connected together in parallel by an intermediate connector board located between said fan modules, each fan module comprising two counter rotating fans in series that provide said airflow in the same direction, and wherein said electrical contacts and said mechanical locator member are on said intermediate connector board.

2. The apparatus of claim 1, wherein said electrical contacts and said mechanical locator are located asymmetrically relative to a center of said fan tray, and said corresponding electrical pads and said corresponding mechanical features are located within said enclosure such that said fan tray may be translated from the front part to the rear part of the enclosure without rotation of the fan tray.

3. The apparatus of claim 1 further comprising projecting portions that extend beyond opposing ends of said fan modules to form opposing handles for inserting the fan tray into and removing the fan tray from the enclosure.

4. The apparatus of claim 3, wherein said intermediate connector board has electrical indicator elements that indicate correct or incorrect positioning of the fan tray within the enclosure.

5. The apparatus of claim 3, wherein said intermediate connector board comprises a printed circuit board having electrical components for controlling said fan modules.

6. The apparatus of claim 5, wherein said electrical contacts comprise movable electrical contacts located adjacent an edge of said printed circuit board, and said cooperating electrical contact pads are formed on an electrical circuit board located within said enclosure such that said movable electrical contacts engage said electrical pads when the fan tray is correctly inserted into the enclosure.

7. The apparatus of claim 2, wherein said mechanical locator element comprises a movable element that engages said mechanical feature of said enclosure to form a mechanical stop.

8. The apparatus of claim 7, wherein said mechanical feature comprises a hole on said enclosure which receives said movable element.

9. The apparatus of claim 1, wherein said electronic components comprise field replaceable units, and said enclosure comprises a rack-mount enclosure that houses a plurality of said field replaceable units, and wherein there are a plurality of fan trays located in the front part and the rear part of said enclosure for providing unidirectional airflow through said enclosure for cooling said field replaceable units.

10. A fan tray for air cooling electronic components within a rack-mount enclosure, the enclosure having a front and a rear, and the fan tray being operable when inserted into either the front or the rear of the enclosure, comprising:

a fan module for providing an airflow in a predetermined direction through the enclosure to remove heat from said electronic components, the fan module having electrical contacts and a mechanical locator element that cooperate with corresponding electrical contact pads and corresponding mechanical features within the enclosure for providing electrical power to the fan module and for correct positioning of the fan tray to enable insertion of the fan tray into either said front part or said rear part of the enclosure while maintaining the same physical orientation of the fan tray relative to the enclosure and the same airflow direction from the fan module through the enclosure when inserted into either the front part or the rear part; and another fan module, said fan modules being connected together in parallel with an intermediate connector board between said fan modules, said electrical contacts comprising movable electrical contacts and said mechanical locator comprising a movable mechanical member located on said intermediate connector board adjacent to an edge thereof for engagement with said electrical contact pads and with said mechanical features, respectively, within said enclosure when said fan tray is inserted into said enclosure, said movable electrical contacts and said movable mechanical member being located asymmetrically on said intermediate connector board relative to a center thereof.

11. The fan tray of claim 10, wherein there are front and rear electrical contact pads and front and rear mechanical features within said enclosure, and wherein said front and rear electrical contact pads and said front and rear mechanical features are respectively located within said enclosure at the front and at the rear thereof so as to be engaged by said asymmetrically located movable electrical contacts and by said asymmetrically located movable mechanical member upon said fan tray being inserted correctly into the front or rear, respectively, of the housing.

12. The fan tray of claim 10, wherein said movable electrical contacts and said movable mechanical member comprise pogo pins.

13. The fan tray of claim 10, wherein said fan module comprises two counter rotating fans in series that provide said airflow in the same direction.

14. The fan tray of claim 10 further comprising projecting portions that extend beyond opposing ends of said fan modules to form opposing handles for inserting the fan tray into and removing the fan tray from the enclosure.

15. The fan tray of claim 14 further comprising electrical indicator elements located on the fan tray that indicate correct or incorrect positioning of the fan tray within the enclosure.

16. The fan tray of claim 10, wherein said intermediate contact board comprises a printed circuit board having electronic components thereon for controlling said fan modules.

* * * * *